United States Patent
Williams et al.

(10) Patent No.: US 9,129,795 B2
(45) Date of Patent: *Sep. 8, 2015

(54) PROCESS FOR PLASMA TREATMENT EMPLOYING CERAMIC-FILLED POLYAMIDEIMIDE COMPOSITE PARTS

(75) Inventors: Scott Howard Williams, Pleasanton, CA (US); Richard William Campbell, Reinholds, PA (US); Stephan Glander, Wettswil (CH)

(73) Assignee: QUADRANT EPP AG, Lenzburg (CH)

( * ) Notice: Subject to any disclaimer, the term of this patent is extended or adjusted under 35 U.S.C. 154(b) by 1157 days.

This patent is subject to a terminal disclaimer.

(21) Appl. No.: 13/083,730

(22) Filed: Apr. 11, 2011

(65) Prior Publication Data

US 2012/0255854 A1    Oct. 11, 2012

(51) Int. Cl.
| | | |
|---|---|---|
| *C23F 1/00* | (2006.01) |
| *H01L 21/306* | (2006.01) |
| *H01L 21/02* | (2006.01) |
| *H01J 37/32* | (2006.01) |
| *C08G 73/14* | (2006.01) |
| *C08L 79/08* | (2006.01) |
| *C08L 71/00* | (2006.01) |
| *C08L 81/02* | (2006.01) |
| *C08L 81/06* | (2006.01) |

(52) U.S. Cl.
CPC ............... *H01L 21/02* (2013.01); *C08G 73/14* (2013.01); *C08L 71/00* (2013.01); *C08L 79/08* (2013.01); *C08L 81/02* (2013.01); *C08L 81/06* (2013.01); *H01J 37/32495* (2013.01); *C08G 2650/40* (2013.01)

(58) Field of Classification Search
USPC ........................ 156/345.43–345.47
See application file for complete search history.

(56) References Cited

U.S. PATENT DOCUMENTS

| | | | | |
|---|---|---|---|---|
| 5,376,213 | A | * | 12/1994 | Ueda et al. ............... 156/345.27 |
| 6,074,488 | A | | 6/2000 | Roderick et al. |
| 6,148,765 | A | | 11/2000 | Lilleland et al. |
| 6,165,276 | A | | 12/2000 | Lu et al. |
| 6,726,799 | B2 | | 4/2004 | Koike |
| 7,252,738 | B2 | | 8/2007 | Tong et al. |
| 7,544,270 | B2 | | 6/2009 | Wege et al. |
| 7,670,688 | B2 | | 3/2010 | Kaushal et al. |
| 7,779,784 | B2 | | 8/2010 | Chen et al. |
| 7,850,779 | B2 | | 12/2010 | Ma et al. |
| 2002/0086545 | A1 | | 7/2002 | O'Donnell et al. |
| 2002/0185229 | A1 | | 12/2002 | Brcka et al. |
| 2003/0165689 | A1 | | 9/2003 | Miller et al. |
| 2004/0216667 | A1 | * | 11/2004 | Mitsuhashi et al. .......... 118/715 |
| 2008/0236744 | A1 | | 10/2008 | Furuse et al. |
| 2009/0163034 | A1 | * | 6/2009 | Larson et al. .................. 438/729 |
| 2010/0140222 | A1 | * | 6/2010 | Sun et al. ......................... 216/67 |

FOREIGN PATENT DOCUMENTS

EP    1464676 A1    10/2004

* cited by examiner

*Primary Examiner* — Rakesh Dhingra
(74) *Attorney, Agent, or Firm* — Brooks Kushman P.C.

(57) ABSTRACT

Internal components of plasma reactors are composed of a toleratable, ceramic filled plasma-useful polymer such as a high temperature engineering thermoplastic, preferably a polyamideimide. The parts exhibit a low erosion rate upon exposure to plasma at low pressure.

6 Claims, 1 Drawing Sheet

PROCESS FOR PLASMA TREATMENT EMPLOYING CERAMIC-FILLED POLYAMIDEIMIDE COMPOSITE PARTS

BACKGROUND OF THE INVENTION

1. Field of the Invention

The invention pertains to industrial processes involving plasma treatment, in which parts of a plasma treating apparatus which are exposed to plasma are constructed of ceramic filled, plasma-useful polymer.

2. Background Art

While plasma is as old as the universe itself, it was first identified as "radiant matter", by Sir William Crookes in 1879, and its nature first described by Sir J. J. Thompson in 1897. "Plasma", the term coined by Irving Langmuir in 1928, is now considered a fourth state of matter, and is a gas in which a certain portion of particles are ionized. The presence of a non-negligible number of charged particles renders plasma, unlike an ordinary gas, electrically conductive. Plasma may be generated by natural sources such as lightning discharges, but industrially useful plasmas are generated by application of electric and/or magnetic fields. Plasmas generated at low pressures include glow discharge plasmas, capacitatively and inductively coupled plasmas, and wave heated plasmas. Plasmas generated at atmospheric pressure include arc discharge, corona discharge, capacitive discharge, and dielectric barrier discharge.

Plasmas have become important industrially in many applications. For example, so-called "corona treatment", which is technically treatment by dielectric barrier discharge, is widely used to alter the surface of thermoplastics by etching and surface functionalization to render the surfaces more acceptive of paints, metal coatings, and adhesives. More recently, plasmas have become very important in the processing of semiconductor wafers and in the fabrication of electronic devices on these wafers. One example of the use of plasma in such applications is Plasma-Enhanced CVD, or "PECVD". In PECVD, a strong electric field ignites a plasma between two electrodes, one of which holds a substrate. The plasma cracks the bonds of the CVD process gas, thus enhancing the role of deposition onto the substrate. Silicon may be deposited from silane by PECVD, for example.

Plasma etching is another common process in semiconductor device fabrication. Here, the plasma produces chemically reactive species from process gases, which react with atoms of the substrate to create volatile species. Ion implant processing, used to create sublayers of different chemical makeup from that of the substrate by ion bombardment, is also a plasma process. These are but few of many examples.

Common to all these plasma processes is the generation of a highly energetic, aggressive, reactive, and corrosive plasma, generally under vacuum conditions. It is just these qualities which make plasma and plasma assisted processes highly efficient. Yet, as is readily imagined and well documented, these properties also take their toll on process equipment. Thus, the portions of the reactor which are exposed to plasma, whether directly or indirectly, and even unintentionally or unavoidably, must be chemically resistant. The low pressures common to many plasma treatments encourages loss of ions and low molecular weight species from components exposed to plasma.

Chemical resistance is necessary in all plasma treatment apparatuses, since erosion of the surface of an apparatus component not only can destroy its net shape, but can also cause chemical degradation which compromises properties such as strength and modulus. Because such processes are generally conducted in moderately high to high vacuum, undesirable outgassing of degradation products may occur. Finally, particulate matter may spall off from eroded surfaces, contaminating the surface of the substrate. In the processing of semiconductor devices, even particles in the low nanometer range can be fatal to the operation of a central processing unit, or memory units such as RAM, DRAM, or SDRAM.

For these reasons, consumable parts in plasma processing chambers have been traditionally made of high temperature inorganic materials such as quartz, fused silica, sapphire (fused alumina), or ceramics such as those prepared from silica, ceria, and alumina. Silicon carbide has also been used, as a coating or as a ceramic material per se, as has also boron nitride. Examples of such parts include assembly screws such as cap screws, wall liners, wafer passage liners, pin lifters, clamp rings, edge rings, a variety of inserts and shields, etc. Examples of such parts may be found in U.S. Pat. No. 6,165,276, and in numerous manufacturers' brochures, for example those from Technics, Tegal, Novellus, and Applied Materials, to name but a few. Due to the expense of the base material, plus the difficulties of machining these exceptionally hard and often brittle components, their cost is quite high. Moreover, they are often brittle and easily damaged.

Manufacturers have long sought to replace such consumable parts with parts of less expensive and more easily machinable materials, but without great success. Metals are generally prohibited, since even the smallest trace amounts of metals can severely compromise integrated circuit behavior. Thus, metals can only be used where there will be no erosion of the metal surface, or where the metal surface is coated with a ceramic material, an expensive process. Many refractory or ceramic materials are also unsuitable, due to contamination of semiconductor substrates with metals. Titanium dioxide is one such material.

U.S. Pat. No. 7,670,688, for example, discloses erosion resistant parts coated with oxides of yttrium, preferably yttria or yttrium aluminum garnet. U.S. Pat. No. 6,074,488 discloses a number of erosion resistant materials. U.S. Pat. No. 6,726,799 discloses the continued need to compensate for erosion of components, proposing an apparatus modification to raise the focus ring of a plasma etching apparatus to compensate for wear rather than constantly replacing the ring.

Polymers would be an excellent choice for reactor internals, provided that they are capable of meeting the materials requirements. However, the fact that polymer surfaces have been plasma modified for decades contravenes the perceived usefulness of polymers. Moreover, because many plasma treatments involve exposure of internal parts to temperatures above 250° C., the choice of polymers is limited to the engineering thermoplastics such as polyether ketone (PEK), polyetheretherketone (PEEK), their variants such as PEKK, polysulfones, polyethersulfones (PES), polyetherimides (PEI), high temperature polyamides, polyamideimides (PAI), polybenzimidazoles, and the like, and thermoset polymers such as those based on epoxy resins, bismaleimides, aromatic cyanates, and the like.

In order to be useful in a plasma apparatus, the polymer must not only meet the temperature requirements and possess adequate mechanical strength and modulus, but it must also be resistant to the plasma environment as well as being free of outgassing and generation of particulates, both as initially installed and after prolonged use.

Etching environments are in general the most severe in plasma processing. There are predominately four plasma-gas mixtures representative of commercial use. These are 100% $O_2$ (typical of preclean etch); 95% $CF_4$/5% $O_2$ (silicon etch); 50% $CHF_3$/25% HBr/12.5% $O_2$/12.5% $Cl_2$ (polysilicon glass etch); and 75% Cl$_2$/25% HBr (main etch). Even without generation of plasma, the corrosive nature of many of these etching mixtures is readily apparent. Their activation by plasma renders them far more energetic and corrosive than the gas mixtures per se.

Attempts to replace plasma reactor parts with less expensive and more easily processed thermoplastics have been done, but for the most part have been disappointing. Prior to the present invention, the only polymers which have achieved limited success were polyimide polymers such as Vespel® SP-1 polyimide, a product of DuPont. However, the erosion rate in oxygen plasma is far higher than satisfactory. The industry has continued to seek for a thermoplastic material which can be used in plasma reactors under plasma exposure conditions.

SUMMARY OF THE INVENTION

It has now been surprisingly and unexpectedly discovered that parts of plasma reactors which are exposed to plasma can be fabricated from ceramic particle-filled, plasma-useful polymers such as polyamideimides, polyimides, polyetheretherketone or polybenzimidazole polymers. The composite parts exhibit useful lifetimes with lessened corrosion and little particulates generation, and can be fabricated at considerably reduced cost compared to parts of ceramic or fused refractory materials, or quartz. Moreover, the parts thus fabricated are far more resistant to breakage.

DETAILED DESCRIPTION OF THE PREFERRED EMBODIMENT(S)

Figure 1:
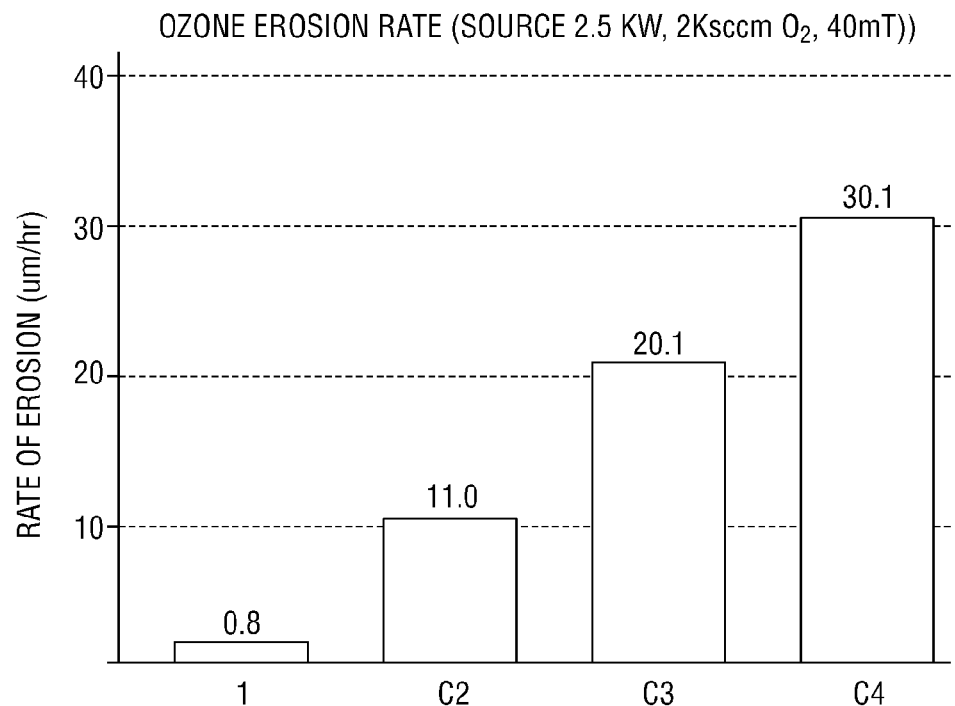
FIG. 1 illustrates the improvement in erosion brought about by the ceramic filled polymers of the invention, in a low pressure oxygen plasma at 2.5 Kw.

The composite parts of the present invention are prepared from plasma-useful polymers such as polyamideimides, polyimides, polybenzimidazoles and polyetherketones. Polyamideimides are preferred, and such resins are available from Solvay Advanced Polymers under the trademark Torlon®. Polyamideimides are also available under the unregistered trademark Tecator™ from Ensinger Industries, Inc., Washington, Pa. Polyamideimides are amorphous, thermoplastic polymers containing both amide and imide linkages, and can be made by several manufacturing methods. The manufacturing method is not critical. However, the molecular weight, as reflected by the polymer properties, is desirably high. Preferred polyamideimides have a tensile strength, measured by ASTM D638, in excess of 80 MPa, preferably in excess of 100 MPa, and most preferably in excess of 120 MPa; and a 264 psi heat deflection temperature per ASTM D648 of 270° C. or higher, preferably about 280° C. or higher.

The use of other plasma-useful polymers such as polyimide polymers, polyetherketone polymers, polysulfones (PS), polyarylenesulfides (PPS) and polybenzimidazole polymers is also possible. Such polymers are also commercially available, e.g. polyimide polymers are available from DuPont under the tradename Vespel®, and polybenzimidazole polymers are available from Quadrant Engineering Plastic Products under the tradename Celazole® PBI. Polyetheretherketones ("PEEK") are available from Victrex Manufacturing Ltd. as Vitrex® PEEK™ polymers. By the term "polyetherkeone" is meant polyetherketones and their variants such as polyetheretherketones, and the like, which are well known engineering thermoplastics, and which are commonly referred to in the industry as PEK, PEEK, PEKK, PEKEKK, PAEK, and the like. Properties and processing of such high temperature thermoplastics is described in numerous references, such as ENGINEERING THERMOPLASTICS, Properties and Applications, J. Margolis, Ed., ©1985, Marcel Dekker, N.Y. By the term "polysulfone" is also meant polysulfone variants such as polyethersulfones and the like. All these polymers herein are referred to hereafter as "plasma-useful polymer(s)". This term should not be interpreted to include polymers other than those mentioned. Plasma useful polymers should have a melting or softening point above 200° C., preferably greater than 250° C., and more preferably above 300° C.

The plasma-useful polymer, preferably a polyamideimide, is ceramic filled. By "ceramic filled" means that the polymer contains ceramic or fused refractory particles as a filler, generally in amounts of from 5 to 40 weight percent, more preferably 10 to 35 weight percent, and most preferably from 10 to 30 weight percent. A single filler may be used, or a combination of one or more fillers may be used. A 20% filler loading is especially preferred in many applications.

The ceramic filler must also meet additional requirements in the amount employed. The filler must be a "tolerable filler" in the sense that in the particular plasma process in which the ceramic filler is employed, the metal of the ceramic filler must be not one which will be liberated from the ceramic during plasma processing and contaminate the substrate being plasma treated with undesirable metal or metal ions. For example, in semiconductor processing, the use of ceramics containing appreciable amounts of titanium, copper, iron, or other heavy metals is contraindicated. In semiconductor plasma processing, for example, alumina, boron nitride, and silicon carbide have been found to be especially useful, since any elements liberated from the ceramic particles either do not interfere with semiconductor processing, or are not liberated in sufficient amounts to interfere with semiconductor processing. The tolerable filler must also be a filler which reduces erosion of the filled polymer to a low level under the plasma operating conditions.

The mean size of the ceramic filler can be within a wide range, but again, this range is dictated in part by the particular plasma process, the substrate being plasma treated, and the nature of the combination of filler and polymer. Combinations of particles may be used. The degree of weight loss of the component part used in a plasma treating reactor, for example, is impossible to predict based on the characteristics of either the ceramic filler alone or the polymer alone. It is the combination which must be assessed. The particle size also plays a part in this assessment. Assessment of a given combination of ceramic filler particles and polymer may be made by one skilled in the art without undue experimentation. The assessment generally is made by fabricating a part or test coupon for assessment and exposing this part to the conditions expected in a plasma reactor for that part, and measuring the weight loss or other important characteristics such as part thickness or particle generation, over time. The time period must be such so as to at least qualitatively determine performance. In plasma semiconductor processes, for example, a time period of 30 to 50 hours may be suitable. Weight loss is easily determined by simply measuring the initial and subsequent weights of the part over time. Particle generation may be measured by trapping particles exiting the plasma reactor in a fine filter, or, in the case of semiconductor substrates, can be measured by traditional particle measurement methods such as light scattering, and the like.

The filler mean particle size is preferably from 100 nm to 100 µm, more preferably 500 nm to 50 µm, and most preferably from 1 µm to 20 µm. A most preferred range of particle sizes is a mean particle size of 4 µm to 20 µm. Particle size may be measured by conventional methods such as laser scattering, or instruments such as a Malvern particle sizer. A monomodal or multimodal particle size distribution of filler particles may be used. It is preferable that very small particles such as those in the range, for example of 1 nm to <100 nm, preferably 1 nm to 50 nm be avoided, as even with the relatively low amount of erosion of the filled polyamideimide parts which takes place, liberation of such small particles from the part surface may occur.

Preferred ceramic materials include ceramics such as ceria, yttria, alumina, silica, yttrium aluminum garnet, other heavy transition metal garnet materials, aluminosilicates, boron carbide, boron nitride, silicon carbide, etc. This list is exemplary, and not limiting. Fused refractory materials include crushed sapphire and quartz glass. The choice of ceramic particle material is not particularly limiting. A preferred ceramic filler is boron nitride, having a mean particle size of about 9 µm.

Without being bound to any particular theory, it is believed that the use of particles especially in the range of 1 µm to 100 µm, preferably 1 µm to 20 µm, results in retention of the particles in the polymer matrix, even though the surrounding polymer may be eroded by the plasma, the particles still being adhered to the polymer matrix at their bottom surfaces. At the same time, it is believed that the size of the particles, in conjunction with their concentration, lowers the ability of the plasma to further erode the polymer between the particles. Very small particles will not show these characteristics, and will show increased polymer erosion as well as exfoliation of particles. A suitable ceramic particle size is easily assessed by the methods described previously. Weight loss and particle generation are the key parameters. It is noted that in some plasma processing, particle generation is not relevant. In these processes, weight loss is the preferred assessment method.

Figure 2:
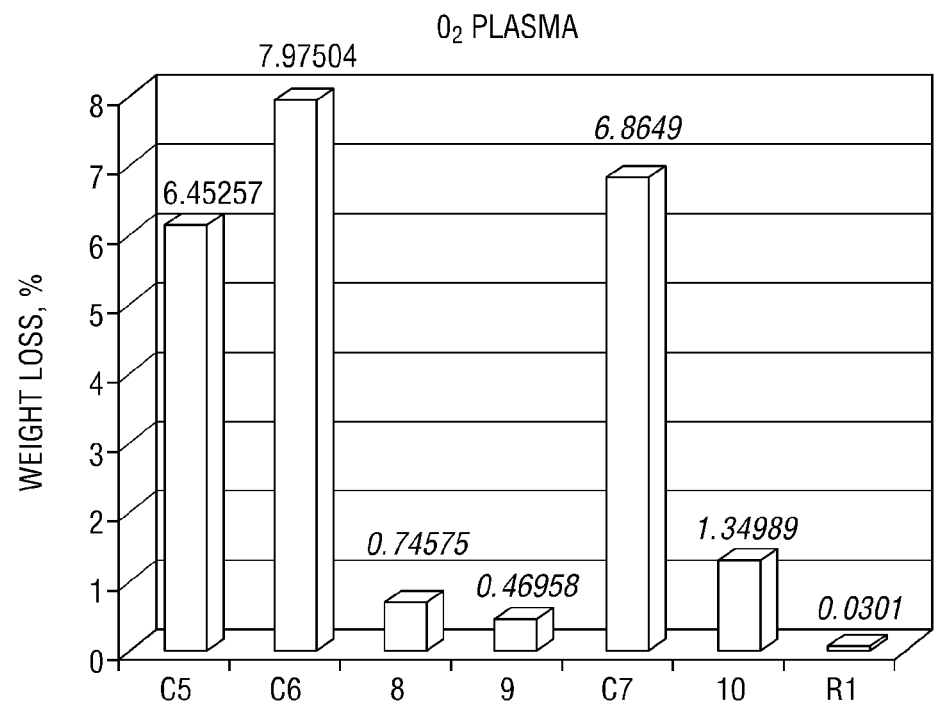
FIG. 2 illustrates erosion, as percentage weight loss, of several materials in a 1 Kw, low pressure oxygen plasma.

Preferably, weight loss is measured in an oxygen plasma under conditions suitable for semiconductor processing. In an oxygen plasma at 0.365 Torr, with $O_2$ being supplied at 1200 SCCM at an energy of 1 Kw, a total weight percentage weight loss after 50 hours should be less than 2%, more preferably less than about 1%, and most preferably about 0.5 weight percent or less. Weight loss under these conditions are shown in FIGS. 1 and 2, FIG. 2 showing total percentage weight loss.

The ceramic filler is added to the polymer by conventional methods, for example by incorporation in kneading devices, mixers, or extruders. The filler may also be incorporated by blending the filler with the polymer, followed by extrusion, injection molding, or compression molding.

Preferably, the composite is molded by extrusion into a desired shape, for example a tube, rod, or sheet, or compression molded into one of these shapes. Since the part will usually be machined to its final shape, a molded shape which is near net shape is desirable whenever possible.

Although silicon carbide, boron carbide, and boron nitride are very toleratable ceramic fillers with respect to semiconductor processing because the components of the filler are generally contained in the silicon substrate, particularly when grown by the most often used Czochralski crystal growth process, it has been surprisingly and unexpectedly found that boron nitride, despite its high hardness, is more easily incorporated into the polymer by conventional methods. Ranges of from 10 to 30 weight percent boron nitride have been found to be especially useful. The concentration of boron nitride is somewhat dependent upon the particular plasma process. For oxygen plasmas, a loading of 20 weight percent has been found to be slightly more effective than loadings of 10 or 30 weight percent, which illustrates that the erosion is not merely a function of the ceramic filler alone. Under these conditions all the boron nitride-filled polyamideimides performed better than the unfilled resin, with performance approaching that of quartz, which is widely used. Upon exposure to 1 KW $CF_4$ plasma at 0.032 Torr, however, 30% by weight boron nitride proved to be superior to either 20% or 10% boron nitride.

Plasma reactors are well known and are available from numerous sources worldwide, for example from Applied Materials, and thus a detailed description of plasma reactors is unnecessary. Plasma reactors have also been thoroughly discussed in the literature. See, e.g. HANDBOOK OF SEMICONDUCTOR MANUFACTURING TECHNOLOGY, R. Doering, Ed., CRC Press, ©2008. Plasma reactors for plasma-assisted deposition are described in U.S. Pat. Nos. 6,165,276 B2; 6,726,799 B2; 7,252,738 B2; 7,544,270 B2; 7,779,784 B2, and 7,850,779 B2, which are incorporated herein by reference.

Applications for the inventive composite parts can be subdivided into three categories, each of which has somewhat different properties. In "near electrode" applications, a polymer service temperature of 350° C. is minimally required. The composite must have near ionic purity, high resistance to plasma, and preferably be capable of surviving energized ozone. For "direct plasma" applications, the part is spaced apart from the electrodes, but will still experience relatively high direct contact by plasma. An example is a confinement ring. In these applications, minimum heat resistance of 250° C. is necessary, and again, very high ionic purity and ability to survive direct plasma attack is necessary. In "indirect plasma" applications, some exposure to plasma is expected, but the plasma will have lower energy or lesser concentration. Examples are clamp rings, chucks, plates, and screws. These must be capable of withstanding operating temperatures of 150° C., must possess excellent chemical resistance, and, in applications where the part contacts semiconductor wafers, high ionic purity.

Currently, near electrode applications are dominated by quartz (low energy) and silicon carbide (high energy), while direct plasma applications are dominated by quartz. Indirect plasma applications are dominated by ceramics, and where polymers have been used in the past, by Vespel® polyimide.

The invention may be further understood by way of the following examples and comparative examples.

Plasma chamber base rings were machined as a 14 inch (355 mm) external diameter, 13 inch (330 mm) internal diameter rings with a thickness of 8 mm. The rings were machined from extruded polyamideimide Torlon 4200 from Solvay, to which is added 20% by weight boron nitride powder having a mean particle size of 9 µm. The properties of the filled and unfilled polyamideimide are given below:

| Property | Test Method | Example 1 | Torlon 4200 (unfilled) |
|---|---|---|---|
| Specific Gravity | ASTM D792 | 1.50 | 1.41 |
| Tensile Strength | ASTM D638 | 16,900 | 20,000 |
| Tensile Modulus psi | ASTM D638 | 1,200,000 | 600,000 |
| Flex Modulus psi | ASTM D790 | 1,050,000 | 600,000 |

Comparative Examples C2-C4

Sample coupons were machined as in Example 1, using unfilled Torlon® polyamideimide (C2), Vespel® SP-1 polyimide (C3), and Ultra High Purity PEEK (C4).

Testing

Testing was performed in a standard plasma etching chamber available from Applied Materials as an AMAT Enabler chamber. The atmosphere was oxygen, which is very aggressive, and the plasma source power was 2.5 kW, which is currently at or near the high end of useful plasma power. Oxygen was supplied at 2K sccm, and the pressure in the chamber was maintained at 40 mT. The erosion was measured by the decrease in sample thickness before and after plasma exposure, and reported in bar graph form in FIG. 1.

The results are highly surprising and unexpected, the unfilled polyamideimide being eroded at a rate more than ten times the rate of the inventive ceramic filled polymer. The base polymer itself is thus clearly not responsible for this improvement. The results show an erosion rate more than 20 times slower than Vespel® polyimide, the default thermoplastic currently being used, and more than 30 times lower than PEEK, a well known high performance engineering thermoplastic.

Test coupons of polyimide (Vespel® SP-1) (C5) PEEK (C6); Torlon® polyamideimide (C7), Quartz (Reference Example R1), and Torlon® polyamideimide with three loadings of boron nitride particles, 30% (by weight) (Example 8), 20% (Example 9), and 10% (Example 10), and exposed to a 1 KW $O_2$ plasma at 1200 SCCM and pressure of 0.365 torr. The coupons were weighed prior to and after exposure for 50 hours. The percentage weight loss is illustrated in FIG. 2.

FIG. 2 shows that the BN-filled polyamideimide had much lower erosion, as reflected by weight loss, of unfilled polyamideimide, PEEK, or polyimide. All three unfilled polymers were similar in performance with high weight loss.

In a similar manner test coupons of unfilled polyimide (C8), unfilled PEEK (C9), unfilled polyamideimide (C10) and polyamideimide containing 20 weight percent of boron nitride powder as a filler Example 11 were exposed to a 2 KW oxygen plasma, $O_2$ at 1200 sccm, pressure 0.30 torr, for 50 hours, and the percent weight loss was measured. The results are presented below:

| Test Coupon | Weight Loss, % |
|---|---|
| quartz (reference) | 1.5 |
| C8 | 36 |
| C9 | 56 |
| C10 | 30 |
| 11 | 6.0 |

As can be seen, the inventive Example 11 showed a surprisingly and unexpectedly low weight loss.

By the term "consists essentially of" with respect to any particular filler is meant that any additional filler, regardless of type or amount, does not substantially alter the erosion performance of the ceramic-filled polymer as opposed to a polymer containing only the same amount of the particular ceramic filler. In particular, for example, when the filler is boron nitride, the addition of non-boron nitride filler in addition to boron nitride, where the erosion performance is neither increased nor decreased by ±10%, is contemplated by this language.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A plasma treating apparatus having a vacuum chamber adapted to receive a substrate to be plasma treated, and at least one apparatus component which is exposed to plasma in an interior of the apparatus, wherein the apparatus component is constructed of a toleratable ceramic-filled polyamideimide polymer, wherein the ceramic consists essentially of boron nitride, wherein the polyamideimide contains from 10 to 30 weight percent of boron nitride.

2. The apparatus of claim 1, wherein said apparatus component is one or more selected from the group consisting of plates, screws, clamp rings, confinement rings, chucks, and base rings.

3. The apparatus of claim 1, wherein the polyamideimide contains from 5 to 40 weight percent of particulate, boron nitride.

4. The apparatus of claim 3, wherein the particulate ceramic filler has a mean particle size of from 4 to 20 µm.

5. The apparatus of claim 1, which is a plasma reactor for the treatment of semiconductor wafers.

6. The apparatus of claim 5, wherein the toleratable, ceramic filled, plasma-useful polymer component exhibits a weight loss, after exposure to a 1 Kw oxygen plasma at 0.365 Torr of less than 1% after an exposure of 50 hours.

* * * * *